United States Patent [19]

Baxter

[11] 4,020,391
[45] Apr. 26, 1977

[54] CRT CURSOR SCAN CONTROL CIRCUITS
[75] Inventor: William D. Baxter, Seymour, Conn.
[73] Assignee: Bunker Ramo Corporation, Oak Brook, Ill.
[22] Filed: Sept. 12, 1975
[21] Appl. No.: 612,892
[52] U.S. Cl. .................. 315/377; 340/324 A; 340/365 S
[51] Int. Cl.² .................................. G01R 13/30
[58] Field of Search ..... 340/324 AD, 365 S, 365 E, 340/324 A; 315/377

[56] References Cited
UNITED STATES PATENTS

| | | | |
|---|---|---|---|
| 3,466,645 | 9/1969 | Granberg et al. | 340/324 A |
| 3,815,127 | 6/1974 | Blumke et al. | 340/365 S |
| 3,911,419 | 10/1975 | Bates et al. | 340/324 AD |

Primary Examiner—Maynard R. Wilbur
Assistant Examiner—T. M. Blum
Attorney, Agent, or Firm—F. M. Arbuckle; Morris Liss

[57] ABSTRACT

The prolonged depression of a cursor scan control key on a CRT terminal keyboard generates a unique coded signal that is fed to a gating circuit. Prolonged depression is further detected by an astable circuit that generates repeated enabling pulses to the gating circuit so that the coded signal is repeatedly transferred to a separate programmable control unit. The unit is programmed to translate the repeated signals to a cursor scan command for a CRT which forms a part of the terminal.

10 Claims, 3 Drawing Figures

CRT CURSOR SCAN CONTROL CIRCUITS

BACKGROUND OF THE INVENTION

FIELD OF THE INVENTION

The present invention relates to CRT data terminals, and more particularly to cursor control circuits that control the scanning position of a cursor character on a CRT portion of the terminal.

BRIEF DESCRIPTION OF THE PRIOR ART

CRT data terminals have long included provision for the generation of a cursor character on the CRT portion of a terminal. The cursor is a unique character that is constantly displayed on a CRT and marks the position that will be occupied by a next character entered via a keyboard. It also indicates the last character of text when data is transmitted to a computer. The cursor advances one position for each character entered from the keyboard.

In the past, a cursor key has been provided on the keyboard of a terminal to permit the editing of data by depressing a cursor key a number of times to cause its movement to a position other than the position next to the character last entered. For example, when used in an editing mode, the cursor locates data to be inserted in text, deleted from text, and erased from text.

In the past, when more than one position movement was desired by a cursor, it was necessary for the terminal operator to repeatedly depress a single cursor key until the number of depressions relate to the desired cursor location. An example of control circuitry that moves the cursor one position at a time is U.S. Pat. No. 3,466,645 (Col. 39 et seq).

As will be appreciated, it would be extremely advantageous if rapid scanning movement of a cursor could be achieved in vertical and horizontal directions, across the face of a CRT. The UNIVAC UNISCOPE 100 display terminal includes a number of control keys which provide a large degree of cursor manipulation. These keys include the capability of the cursor to rapidly scan forward, back, up and down. In utilization of the device, if any of these control keys are quickly depressed a single time, the cursor will move in a corresponding direction, one position at a time. However, if a particular control key is held down, circuitry is provided for detecting this occurrence and causing a rapid scanning motion in the desired direction, of the cursor.

BRIEF DESCRIPTION OF THE PRESENT INVENTION

The present invention is directed to novel circuitry for achieving the scanning motion of a cursor on a CRT in a desired direction. Briefly, a decoder is provided for detecting the unique coded signals that relate to various cursor control keys that control scanning movement in various directions, across a CRT screen. A time delay is responsive to the detection of control key depression and in the event a cursor control key is held down, the time delay triggers an astable which generates repeating enable pulses. These pulses are gated with the particular unique coded signal of a control key so that the signal becomes manifested in a repeating manner. A separate programmable control unit is connected to the repeating coded signal and translates the repeated signal to a scan command, in the desired direction.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
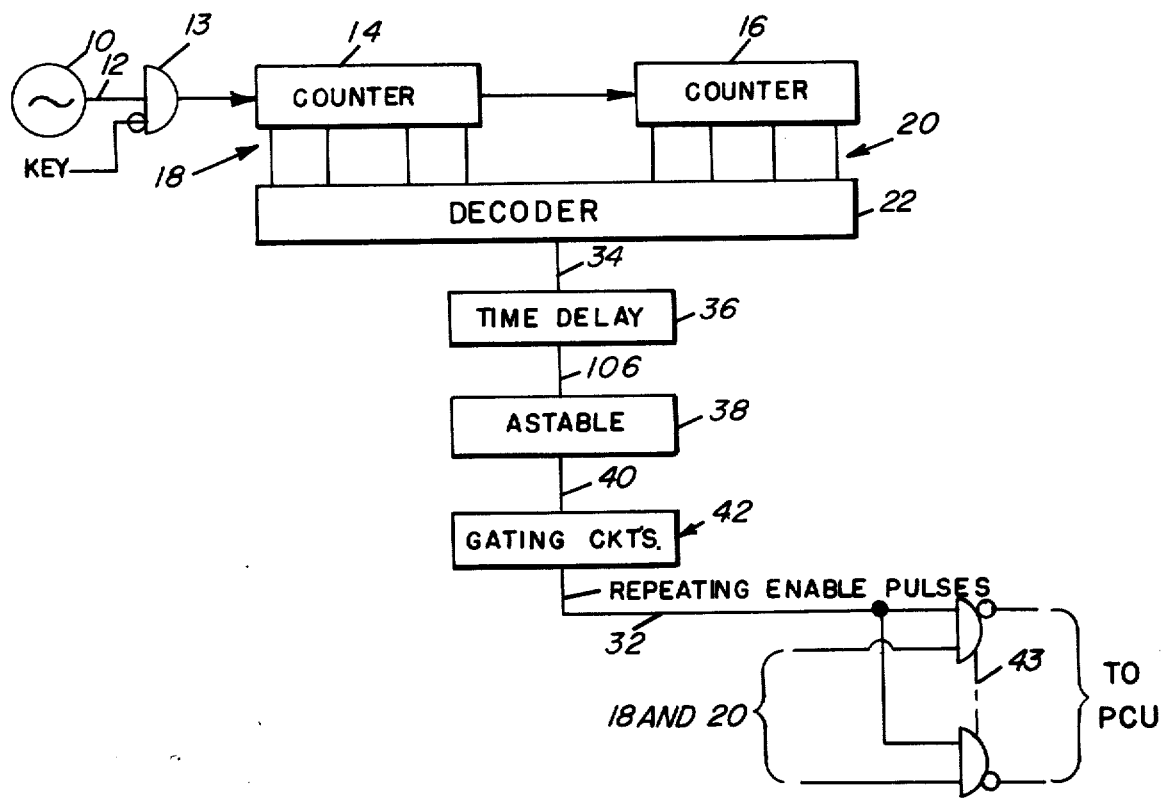
FIG. 1 is a block diagram of circuitry which detects prolonged depression of a cursor scan control key.

Referring to the figures and more particularly FIG. 1 thereof, a block diagram is illustrated, for means which detect the prolonged depression of a cursor scan control key.

A free-running oscillator 10 has its output line 12 connected to a four bit counter 14, through an AND gate 13. The gate 13 is provided with a second input that is connected to a cursor scan control key, to be discussed hereinafter. The counter 14, in turn is connected with a second four bit counter 16. The counters 14 and 16 operate in a normally counting steady state until a cursor scan control key is depressed, which delivers a binary 0 input to the gate 13, thereby inhibiting further counting by the counters 14 and 16. As will be explained in further detail hereinafter, a number of cursor scan control keys are provided on a keyboard, each key being capable of controlling cursor scanning motion in a different vertical and horizontal direction. Thus, by utilizing separate cursor scan control keys, it is possible to obtain scanning motion in the following directions: up, down, forward and back.

The four bit output lines 18 from counter 14 and the four bit output lines 20 from counter 16 will produce unique coded signals corresponding to a particular cursor scan control key that has been depressed. The decoder 22 is of a conventional design and detects the occurrence of any of the unique coded signals corresponding to related cursor scan control keys. If a positive detection is made, the decoder generates an output signal along line 34 which is fed to a time delay 36. If the time delay 36 detects that the coded signal exists for a preselected period of time then the circuit has ensured that a cursor scan control key has been held down or depressed for a prolonged period of time indicating that a scanning motion of the cursor is desired, by a terminal operator. An output line 106 connects the time delay 36 to an astable multivibrator (astable) 38 which is controlled by the output from the time delay 36. The astable generates, along line 40, repeated enable pulses in the event that a prolonged depression of a cursor scan control key occurs. The repeated pulses are gated through a number of gating circuits 42 and presented to a number of additional gates, generally indicated by reference numeral 43. Each of the gates 43 is connected to the line 32 upon which the repeated enable pulses are carried. In addition, each of the gates 43 is connected to a corresponding bit from counters 14 and 16. Thus, it will be appreciated a total of eight gates 43 are required in the illustrative example presented herein. When repeating enable pulses are transmitted along line 32, the output lines from gates 43 will repeatedly generate the unique coded signal corresponding to the particular cursor scan control key that has been depressed. This coded signal may then be transmitted to a programmable control unit, which per se, does not form a part of the present invention. The programmable control unit is programmed so that it is capable of translating the repeated signal to a cursor scan command for a CRT video circuit (not shown) that will cause the desired scanning motion of a cursor on a CRT screen (not shown).

Figure 2:
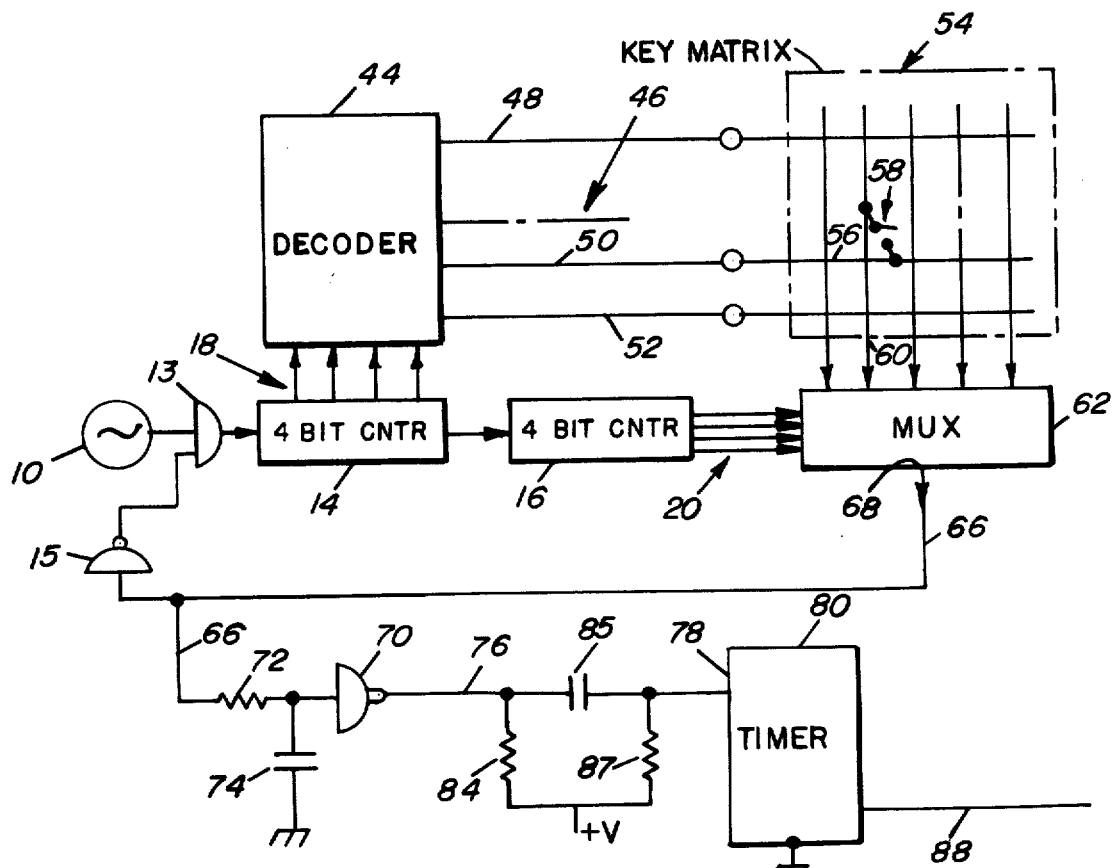
FIG. 2 is a logic diagram of a debounce circuit for verifying the validity of a cursor scan control key depression.

Referring to FIG. 2, more detailed logic circuits of the present invention are shown. A four bit counter 14 is seen to provide four output lines to the decoder 44 which is a 4:16 decoder, such as manufactured by Texas Instruments, and known as a 74154 chip. This decoder sequentially energizes the output lines generally indicated by reference numeral 46. These output lines are connected to corresponding rows in a key matrix 54. The output line 48 forms the upper row of the matrix, while the output line 52 is connected with the lowest row of the matrix 52. The matrix is a keyboard switch matrix, of conventional design. In its application to the present invention, the key matrix includes all the cursor scan control keys that correspond with the various scanning direction for a cursor. In a typical embodiment of the present invention, a particular output line 50, corresponding with row 56 of the key matrix, has all the cursor scan control keys connected therealong. Each key includes an individual conventional switch. One such key is indicated as 58. One side of the switch is connected to row 56, while the other side of the switch is connected to a column 60. Each cursor scan control key would have its first side connected along row 56. However, the second side of each such control key will be connected to a different column of the key matrix 54. If, for example, the switch 58 corresponding to a particular cursor control key, is depressed, an input along line 60, from the key matrix 54 will be presented to the multiplexer hereinafter referred to as MUX 62. The MUX is commercially available from Texas Instruments and is known as a 74150 chip. A second series of MUX inputs are provided from the four bit counter 16 and carry the information of the previously mentioned lines 20. A positive output, at terminal 68, is transmitted along output line 66, from MUX 62, when any of the cursor scan control keys are depressed. The signal along line 66 is inverted through inverter 15 and subsequently fed to the previously mentioned AND gate 13. This will inhibit further counting of the counters 14 and 16 thereby maintaining the present count of these counters, as long as the cursor scan control key remains depressed. In addition to inhibiting further counting of the counters 14 and 16, the signal along line 66 is transmitted to debounce circuitry illustrated in FIG. 2. The output signal on line 66 is driven through the RC combination 72, 74 for filtering, to an inverter 70 which inverts the signal from line 66. The signal from the inverter 70 is fed, along line 76, to the input 78 of a timer circuit 80, such as made by Signetics Corp. and identified as chip 555. However, the input signal along line 76 is first processed by a Pi configuration RC combination 84, 85, 87, which serves as a differentiator for the input signal to timer circuit 80. An output signal is generated by the timer circuit 80, along lead 88, when the input to the timer circuit 80 exceeds an interval that may be associated with noise or other transient phenomena. In the exemplary embodiment disclosed, the purpose of the timer circuit 80 is to provide a 10 millisecond debounce detection circuit for ensuring that a valid depression of a key has occurred. This is evidenced by an output signal on line 88. As will be seen hereinafter, in the following discussion of FIG. 3, the signal along line 88 is used in gating circuits that permit the dumping of a unique coded signal, in repeating fashion, to a programmable control unit.

Figure 3:
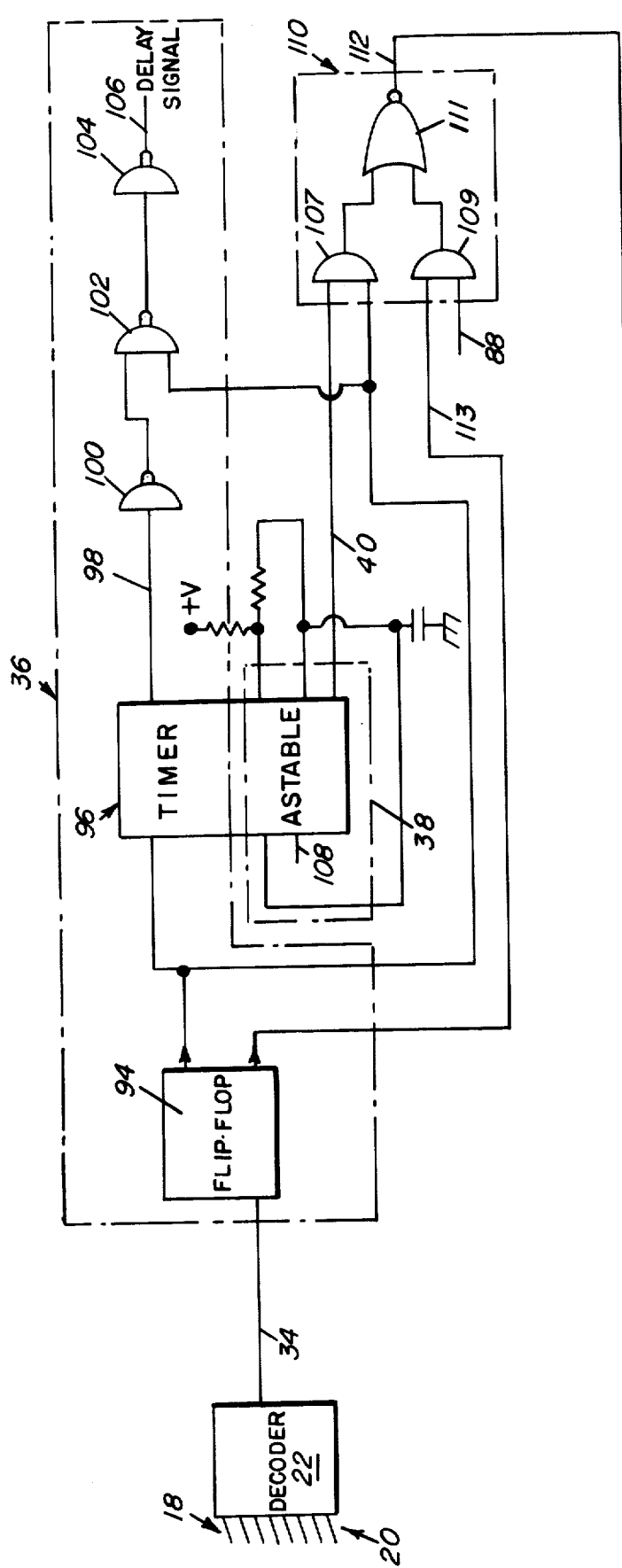
FIG. 3 is a logic diagram of the circuitry which controls the dumping of unique coded signals, corresponding to the cursor scan control keys depressed, to a programmable control unit.
Figure 3:
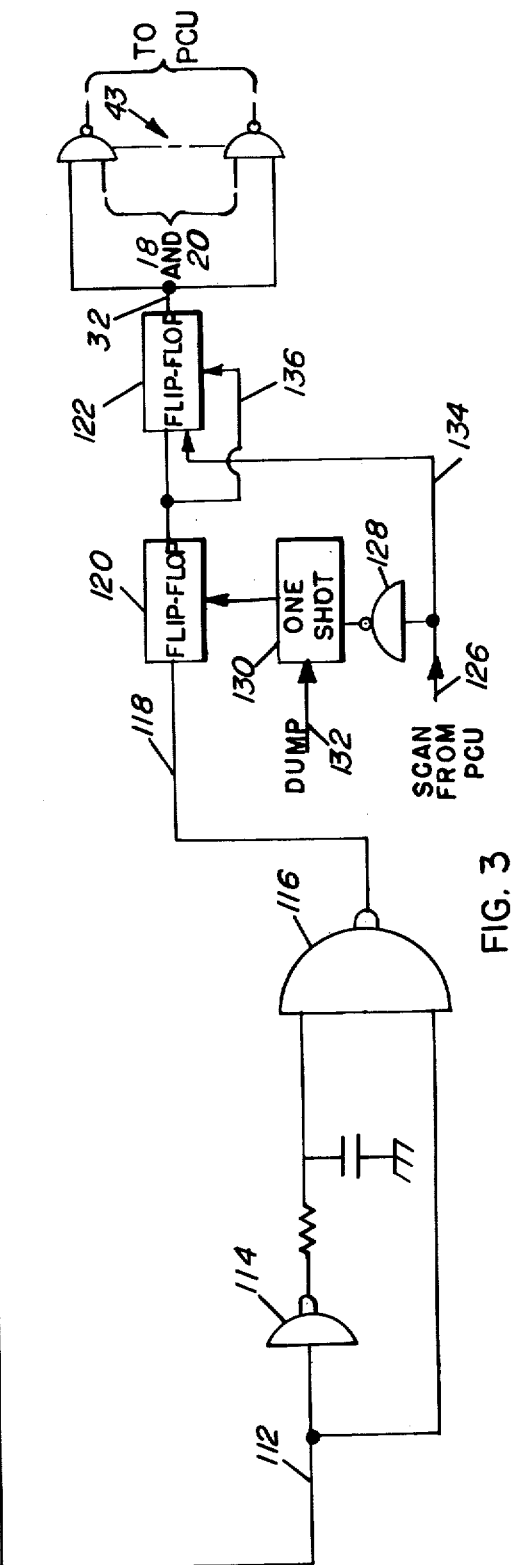

Referring to FIG. 3, the decoder 22 is seen to provide an input, along line 34, to the time delay circuit generally indicated by reference numeral 36. This corrsponds to the general block diagram previously explained in connection with FIG. 1. The time delay circuit 36 is more particularly seen to include a flip-flop 94 which has an output connected to a first half of a dual timer chip. Typically, this may be of the type manufactured by Signetics Corp, and identified as a 556 dual timer chip. In the figure, the timer chip is indicated by reference numeral 96. The output 98 from the first half of the timer chip is inverted at 100, gated at 102, and again inverted at 104 to provide a delay signal at line 106. The signal at line 106 is fed back at terminal 108 to the second half of the dual timer chip 96. The second half of the dual timer chip 96 is connected in an astable configuration. The second half of the dual timer chip 96 has been blocked off and referred to by reference numeral 38, to correspond with the astable block 38 in FIG. 1. The output from the astable 38 (FIG. 3) is fed along line 40, previously referenced in FIG. 1, and drives an AND-OR gate network generally indicated by reference numeral 110. Line 88 from timer circuit 80 (FIG. 2) is also connected to the AND-OR gate network 110 so that the astable signal, along line 40, is gated with the signal that is generated from the timer circuit 80. As will be recalled, the signal generated from the timer circuit 80, along line 88, represents a debounced signal indicating a valid cursor scan control key depression. The output line 112 from the AND-OR gate network is inverted at inverter 114 and then is fed to gate 116 for generating narrow pulses on output line 118, indicative of the repeating enable pulses indicated along line 32 of FIG. 1.

The repeating pulses on line 118, from the output of gate 116, is fed to a flip-flop 120, which in turn enables flip-flop 122. Upon the occurrence of a scan signal at line 126, from a programmable control unit (PCU-not shown), an enable signal is transferred, along line 134 to the flip-flop 122 which causes the flip-flop 122 to set and generate an enable signal at 32. Upon the occurrence of this enable signal, which will be repeating, the unique coded signal derived from the counter output lines 18 and 20 passes through corresponding gates 43 to the PCU, for appropriate processing by subsequent video circuits, which do not form part of the present invention.

When the scan signal appearing at 126 is dropped, the falling edge, appearing on line 126, passes through an inverter 128 and fires a one-shot 130. In order to ensure that there is coincidence between the falling edge of the scan signal at 126, and the dumping of a uniquely coded signal from the gates 43, a second input line 132 carries a dump command from a PCU which is provided to the one-shot multivibrator 130. As a result, a pulse signal is derived at the output of the one-shot 130, serving to reset the flip-flop 120. Resetting of this flip-flop is communicated, along line 136, to reset the second flip-flop 122. This inhibits further generation of repeating enable pulses along line 32. Thus, further dumping of a repeating unique coded signal through the gates 43, to the PCU is halted.

After the completion of an operation cycle as just discussed, the circuitry as indicated in the figures, and which is in accordance with the present invention, is prepared for the generation of another or the same unique coded signal corresponding with the prolonged depression of another or the same cursor scan control key by a terminal operator.

Although the previous discussion relates to the primary objects of the invention, namely the generation of repeating enable pulses, the circuitry shown in FIG. 3 shows separate provision for the generation of a single enable pulse, in the event that a depressed cursor scan control key is held down for less than the time interval required for repetition. In the previous case, where repeating enable pulses were generated, the AND gate 107 became actuated and as a result, a signal, along line 112, was produced through the OR gate 111. A single enable pulse can also be produced along line 112, in the event that a particular cursor scan control key is depressed for an interval less than that required for repetition. This would be the case when it is desired for a cursor to scan in a preselected direction, a single position at a time. This will occur when an input, along line 88, is fed to AND gate 109, along with a second input from line 113, connected to the flip-flop 94. An output from gate 109 will occur, when there is coincidence between a signal at 88, representing a debounced cursor scan control key depression, and the detection of a unique coded signal which becomes manifest by the decoder 22 and flip-flop 94, to which the line 113 is connected. When a single enable pulse is carried on line 112, the circuitry which operates upon the pulse, as shown in FIG. 3, operates identically, with the exception that the gates 43 permit the passage of the unique coded signal. This way, a PCU may effect cursor movement, for only a single position at a time.

It should be understood that the invention is not limited to the exact details of construction shown and described herein for obvious modifications will occur to persons skilled in the art.

What is claimed as new and desired to be secured by Letters Patent of the United States is:

1. A scan control circuit for a CRT cursor comprising:
   at least one cursor scan control key positioned in a keyboard;
   means connected to the key for producing a unique coded signal in response to depression of the respective key;
   first decoding means connected to the output of the signal producing means for decoding the coded signal;
   means connected to the output of the first decoding means for detecting the occurrence of the coded signal for a preselected time interval indicative of prolonged cursor scan control key depression;
   means connected to the output of the detecting means for generating repeating enable pulse signals during prolonged cursor scan control key depression;
   first gating means having first inputs thereof connected to the output of the generating means, second inputs thereof connected to the output of the coded signal producing means, the first gating means producing repeating coded signals at the output thereof, in response to coincidence of signals at the first and second inputs; and
   means for connecting the output of the first gating means to a programmable control unit.

2. The subject matter of claim 1 wherein the means for producing a unique coded signal comprises:
   counter means;
   second gating means having an output thereof connected to the input of the counter means, first input means of the second gating means connected to an oscillator for incrementing the count of the counter means, second input means of the second gating means connected in circuit with the cursor scan control key for inhibiting the count and ensuring that a count, corresponding to a unique coded signal for the key, is maintained, when the key is depressed.

3. The subject matter of claim 1 wherein the detecting means comprises:
   time delay means connected to the output of the first decoding means for delaying a signal therefrom; and
   third gating means for detecting coincidence between the delayed signal and an undelayed signal from the first decoding means, coincidence detection being indicative of prolonged cursor scan control key depression.

4. The subject matter of claim 2 wherein the counter means includes first and second binary counters and further wherein the second input means of the second gating means further includes:
   second decoding means connected at its input to the output of the first counter;
   means connecting the output of the second decoding means to respective rows of a key matrix that includes the cursor scan control key;
   a multiplexer having first inputs thereof connected to respective columns of the matrix, second inputs of the multiplexer connected to the output of the second counter;
   the cursor scan control key including means connecting a first pole thereof to a preselected row of the matrix;
   means connecting a second pole of the key to a respective column of the matrix;
   closure of the key causing an output signal to be produced by the multiplexer; and
   means for connecting the output of the multiplexer to a second input of the second gating means for causing the counters to stop counting in response to an output signal from the multiplexer.

5. The subject matter of claim 3 wherein the means for generating repeating enable pulse signals comprises:
   an astable multivibrator having its input connected to the output of the third gating means, and triggered by coincidence detection by the third gating means, for generating the repeating enable signals.

6. The subject matter of claim 1 together with control means connected between the output of the generating means and the first input of the first gating means, the control means comprising:
   switching means connected at a first input thereof to the output of the generating means, the output of the switching means connected to the first inputs of the first gating means;
   means connected to a second input of the switching means for communicating a scan command signal from a programmable control unit, to the switching means thereby permitting the passage of repeating enable pulses from the generating means to the first gating means; and means connected to a third input of the switching means which subsequently communicates a dump signal from a programmable control unit to the switching means for changing the state of the switching means and inhibiting the passage of repeating enable pulses to the first gating means.

7. In a CRT data terminal, a scan control circuit for a CRT cursor comprising:

a plurality of cursor scan control keys positioned in a keyboard portion of the terminal;

counter means for sequentially incrementing a count;

first gating means having an output thereof connected to a first input of the counter means, first input means of the first gating means connected to an oscillator for incrementing the count, second input means of the first gating means connected in circuit with the cursor scan control keys for inhibiting the count and ensuring that a count, corresponding to a unique coded signal, for a key, is maintained when the key is depressed;

first decoding means connected to the output of the counter means for decoding each coded signal;

time delay means connected to the output of the first decoding means for delaying a signal therefrom;

second gating means for detecting coincidence between the delayed signal and an undelayed signal from the first decoding means, coincidence detection being indicative of prolonged cursor scan control key depression;

means connected to the output of the second gating means for generating repeated enable pulse signals during prolonged cursor scan control key depression;

third gating means having first inputs thereof connected to the output of the generating means, second inputs thereof connected to the output of the counter means, the third gating means producing repeating coded signals at the output thereof, in response to coincidence of signals at the first and second inputs; and means for connecting the output of the third gating means to a programmable control unit.

8. The subject matter set forth in claim 7 wherein the means for generating repeating enable pulse signals comprises:

an astable multivibrator having its input connected to the output of the second gating means, and triggered by coincidence detection by the second gating means, for generating the repeating enable signals.

9. The subject matter of claim 7 wherein the counter means includes first and second binary counters and further wherein the second input means of the first gating means further includes:

second decoding means connected at its input to the output of the first counter;

means connecting the outputs of the second decoding means to respective rows of a key matrix including the cursor scan control keys;

a multiplexer having first inputs thereof connected to respective columns of the matrix, second inputs of the multiplexer connected to the output of the second counter;

each cursor scan control key including means connecting a first pole thereof to a preselected row of the matrix;

means connecting the second pole of each cursor scan control key to a respective column of the matrix;

closure of any key causing an output signal to be produced by the multiplexer; and means connecting the output of the multiplexer to a second input of the first gating means for causing the counters to stop counting in response to an output signal from the multiplexer.

10. The subject matter set forth in claim 8 together with control means connected between the output of the astable multivibrator and the first input of the third gating means, the control means comprising:

switching means connected to a first input thereof to the output of the astable multivibrator, the output of the switching means connected to the first input of the third gating means;

means connected to a second input of the switching means for communicating a scan command signal, from a programmable control unit, to the switching means thereby permitting the passage of repeating enable pulses from the astable multivibrator to the third gating means; and means connected to a third input of the switching means which subsequently communicates a dump signal from a programmable control unit to the switching means for changing the state of the switching means and inhibiting the passage of repeating enable pulses to the third gating means.

* * * * *